(12) United States Patent
Lee et al.

(10) Patent No.: US 9,338,923 B2
(45) Date of Patent: May 10, 2016

(54) IMAGE DISPLAY DEVICE

(71) Applicant: LG ELECTRONICS INC., Seoul (KR)

(72) Inventors: Jiyong Lee, Seoul (KR); Hyunchul Lee, Seoul (KR); Sungwook Han, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 104 days.

(21) Appl. No.: 14/445,473

(22) Filed: Jul. 29, 2014

(65) Prior Publication Data

US 2015/0124403 A1    May 7, 2015

(30) Foreign Application Priority Data

Nov. 6, 2013    (KR) .......................... 10-2013-0134329

(51) Int. Cl.
*H05K 7/20* (2006.01)
*G03B 21/16* (2006.01)

(52) U.S. Cl.
CPC ............ *H05K 7/20145* (2013.01); *G03B 21/16* (2013.01); *H05K 7/20209* (2013.01); *H05K 7/20972* (2013.01); *H05K 2007/20072* (2013.01)

(58) Field of Classification Search
CPC .. G06F 1/20; H05K 7/20972; H05K 7/20136; G02F 1/133385; F21V 29/50
See application file for complete search history.

(56) References Cited

U.S. PATENT DOCUMENTS

| | | | | |
|---|---|---|---|---|
| 5,991,153 A * | 11/1999 | Heady | ..................... | H05K 7/202 165/185 |
| 6,212,069 B1 * | 4/2001 | Janik | ..................... | G06F 1/1616 165/86 |
| 6,226,180 B1 * | 5/2001 | Ueda | ......................... | G06F 1/20 361/689 |
| 6,243,261 B1 * | 6/2001 | Janik | ..................... | G06F 1/1615 361/679.46 |
| 7,161,803 B1 * | 1/2007 | Heady | ................... | H05K 7/2099 165/104.33 |
| 2006/0170879 A1 | 8/2006 | Kato et al. | | |
| 2009/0147175 A1 * | 6/2009 | Tsumura | ............ | H05K 7/20963 349/58 |
| 2012/0223877 A1 * | 9/2012 | Cho | ................... | G02F 1/133385 345/102 |
| 2012/0255721 A1 * | 10/2012 | Kim | ................... | G02F 1/133382 165/288 |
| 2013/0242542 A1 * | 9/2013 | Uchimi | ................. | F21V 29/027 362/97.1 |

FOREIGN PATENT DOCUMENTS

| | | | |
|---|---|---|---|
| EP | 2 085 858 A1 | 8/2009 | |
| EP | 2 256 548 A1 | 12/2010 | |
| JP | 2006-072138 A | 3/2006 | |
| KR | 10-2004-0056341 A | 6/2004 | |
| WO | WO 2005/079129 A1 | 8/2005 | |

OTHER PUBLICATIONS

European Search Report dated Mar. 11, 2015 issued in Application No. 14183626.2.

* cited by examiner

*Primary Examiner* — Robert J Hoffberg
*Assistant Examiner* — Hung Dang
(74) *Attorney, Agent, or Firm* — Ked & Associates, LLP

(57) ABSTRACT

An image display device is provided that efficiently cools a display and internal circuit components thereof. The image display device includes a display for displaying visual information, circuit components spaced apart from a rear side of the display, a fan installed on the rear side of the display that generates an airflow from one side of the display to the other side of the display so as to cool the display and the circuit components, and an airflow distribution device facing the fan to selectively distribute the airflow generated by the fan towards the display and the circuit components based on temperatures of the display and the circuit components.

20 Claims, 5 Drawing Sheets

IMAGE DISPLAY DEVICE

CROSS-REFERENCE TO RELATED APPLICATION(S)

This application claims priority under 35 U.S.C. §119 to Korean Application No. 10-2013-0134329 filed in Korea on Nov. 6, 2013, whose entire disclosure is hereby incorporated by reference.

BACKGROUND

1. Field

This relates to an image display device, and more particularly, to a heat dissipation structure for an image display device.

2. Background

Image display devices may receive and output broadcasts, record and reproduce video, and record and reproduce audio. Such image display devices may include, for example, televisions, monitors, projectors, tablets, and the like. Image display devices may take the form of a multimedia player having comprehensive functions such as outputting broadcasts, reproducing video, capturing photos and moving images, playing games, receiving broadcasts, and the like.

Signs to be installed outdoors to convey information may be affected by the installation environment, unlike televisions or monitors, which would normally be operated indoors. For instance, outdoor signs installed in areas exposed to large amounts of sunshine not only generate heat internally but are also heated by sunlight, increasing the possibility of failure as the level of sunlight increases. In addition to being heated by sunlight, the image display device may experience a rise in internal temperature due to heat generated by circuit components, and more than an acceptable amount of heat may cause failure of the circuit components, particularly in areas where the heat is concentrated.

BRIEF DESCRIPTION OF THE DRAWINGS

The embodiments will be described in detail with reference to the following drawings in which like reference numerals refer to like elements wherein.

DETAILED DESCRIPTION

Figure 1:
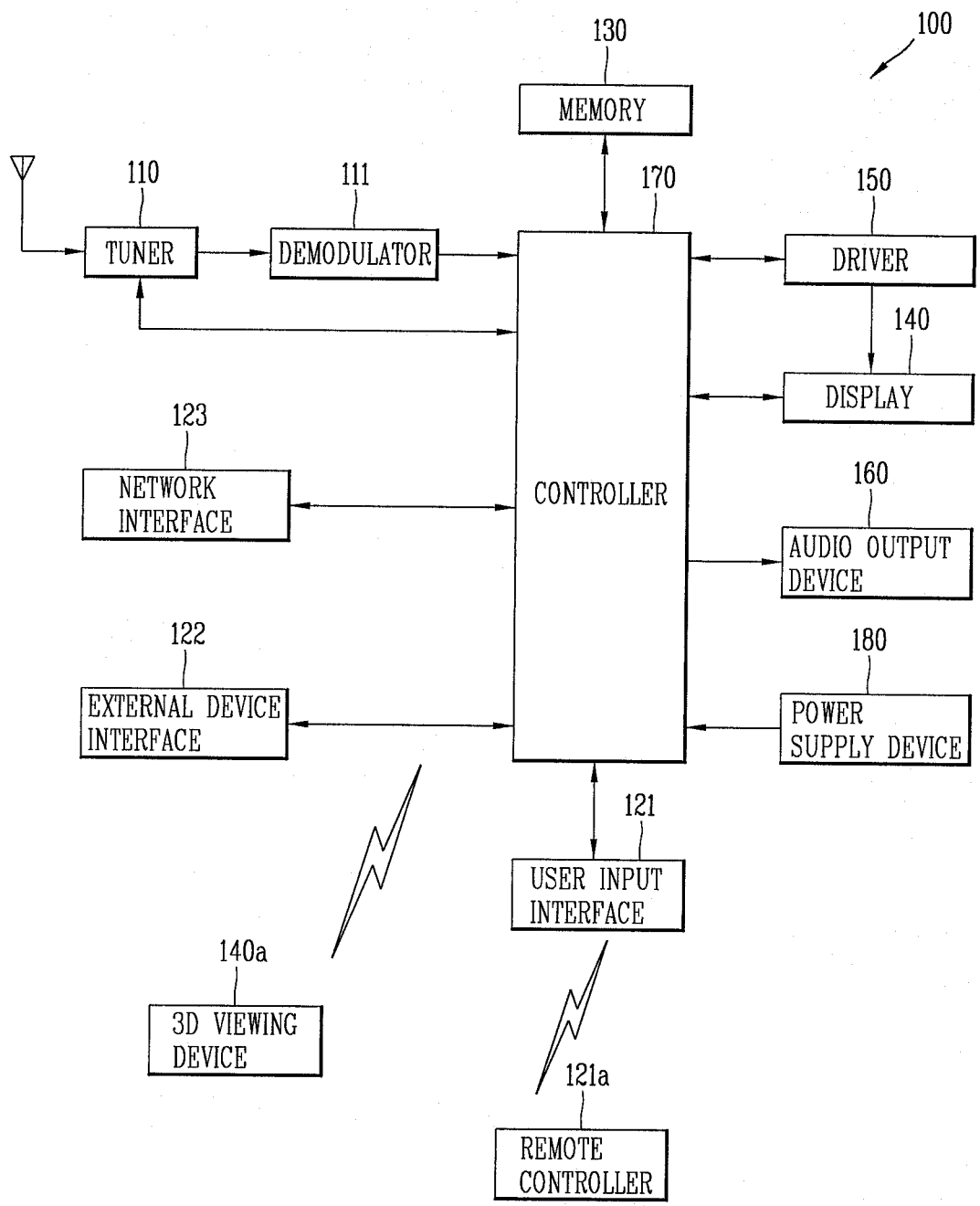
FIG. 1 is a block diagram of an image display device and a remote controller, according to embodiments as broadly described herein.

Hereinafter, an image display device according various embodiments will be described in more detail with reference to the drawings. The specification may specify like/similar components with like/similar reference numerals even in different embodiments, so the description thereof will be conveyed by the first description. Singular expressions used herein may include plural expressions unless they have opposite meanings.

Image display devices may include devices that receive and output broadcasts, devices that record and reproduce video, and devices that record and reproduce audio. A television will be used hereinafter as an exemplary image display device, simply for ease of discussion.

Referring to FIG. 1, an image display device 100 as embodied and broadly described herein may include a tuner 110, a demodulator 111, an external device interface 122, a network interface 123, a memory 130, a user input interface 121, a controller 170, a display unit 140, a driver 150, an audio output device 160, a power supply device 180, and a 3D viewing device 140a.

The tuner 110 may select an RF (radio frequency) broadcast signal received through an antenna, which corresponds to a channel selected by the user, or all previously stored channels. Also, the tuner 110 may convert the selected RF broadcast signal to an intermediate frequency signal or a baseband video or audio signal.

The tuner 110 converts the selected RF broadcast signal into a digital IF signal DIF if the selected RF broadcast signal is a digital broadcast signal, for example, and converts the selected RF broadcast signal into an analog baseband video or audio signal CVBS/SIF if the selected RF broadcast signal is an analog broadcast signal. That is, the tuner 110 can process both the digital broadcast signal and the analog broadcast signal. The analog baseband video or audio signal CVBS/SIF output from the tuner 110 may be directly input to the controller 170.

The tuner 110 may also receive RF broadcast signals from a single carrier based on an advanced television system committee (ATSC) mode and RF broadcast signals from multiple carriers based on a digital video broadcasting mode (DVB).

The tuner 110 sequentially selects RF broadcast signals from broadcast channels stored through a channel memory function from RF broadcast signals received through the antenna, and converts the selected RF broadcast signals to intermediate frequency signals or baseband video or audio signals.

The demodulator 111 receives the digital IF (DIF) signal converted by the tuner 110 and demodulates the received digital IF signal.

For example, if the digital IF signal output from the tuner 110 is based on the ATSC mode, the demodulator 111 performs 8-vestigal side band (8-VSB) demodulation. Also, the demodulator 111 may perform channel decoding. To this end, the demodulator 111 may include a trellis decoder, a de-interleaver, and a Reed-Solomon decoder to perform trellis decoding, de-interleaving, and Reed-Solomon decoding.

For example, if the digital IF signal output from the tuner 110 is based on the DVB mode, the demodulator 111 performs coded orthogonal frequency division modulation (COFDMA) demodulation, for example. Also, the demodulator 111 may perform channel decoding. To this end, the demodulator 111 may include a convolution decoder, a de-interleaver, and a Reed-Solomon decoder to perform convolution decoding, de-interleaving, and Reed-Solomon decoding.

The demodulator 111 may output a stream signal (TS) after performing demodulation and channel decoding. The stream signal may be a signal where a video signal, an audio signal and a data signal are multiplexed. For example, the stream signal may be MPEG-2 Transport Stream (TS) where a video signal of an MPEG-2 specification and an audio signal of Dolby AC-3 specification are multiplexed. Specifically, the MPEG-2 TS may include a 4-byte header and a 184-byte payload.

In the mean time, the aforementioned demodulator 111 may be provided separately depending on the ATSC mode and the DVB mode. Namely, an ATSC demodulator and a DVB demodulator may be provided separately.

The stream signal output from the demodulator 111 may be input to the controller 170. The controller 170 may perform demultiplexing, video/audio signal processing, etc. and then output video to the display 140 and audio to the audio output device 160.

The external device interface 122 may connect an external device to the image display device 100. To this end, the external device interface 122 may include an A/V input/output device or a wireless communication device.

The external device interface 122 may be connected to external devices such as Digital Versatile Disks (DVD), Blu-rays, game devices, cameras, camcorders, computers (e.g., laptops), etc. through wire/wireless cables. The external device interface 122 transmits a video, audio, or data signal externally input through an external device connected thereto, to the controller 170 of the image display device 100. Also, the external device interface 122 outputs the video, audio or data signal processed by the controller 170 to the external device. To this end, the external device interface 122 may include an A/V input/output device or a wireless communication device.

The A/V input/output unit may include a USB terminal, a composite Video Banking Sync (CVBS) terminal, a component terminal, an S-video terminal (analog), a Digital Visual Interface (DVI) terminal, a High Definition Multimedia Interface (HDMI) terminal, an RGB terminal, a D-SUB terminal, etc., to input video and audio signals of the external device to the image display device 100.

The wireless communication device may perform a short-distance wireless communication with other electronic devices. For example, the image display device 100 may establish network connections with other electronic devices according to communication standards such as Bluetooth, Radio Frequency Identification (RFID), infrared Data Association (IrDA), Ultra Wideband (UWB), ZigBee, etc.

In addition, the external device interface 122 may be connected to various set-top boxes through at least one of the above-mentioned various terminals to perform input/output operations with the set-top boxes.

The external device interface 122 may transmit and receive data to and from the 3D viewing device 140*a*.

The network interface 123 may provide an interface for connecting the image display device 100 to a wired/wireless network including an Internet network. The network interface 123 may include an Ethernet terminal, etc for a wired network connection. Wireless LAN (WLAN) (Wi-Fi), Wireless broadband (Wibro), World Interoperability for Microwave Access (Wimax), High Speed Downlink Packet Access (HSDPA), etc may be used for a wireless network connection.

The network interface 123 may receive content or data provided by an Internet or content provider or a network manager over a network. That is, the network interface 123 may receive content such as movies, advertisements, games, VOD, or broadcast signals and information associated with the content provided by the Internet or content provider over a network. The network interface 123 may receive update information and update files of firmware provided by the network manager. The network interface 123 may transmit data to the Internet or content provider or to the network manager.

The network interface 123 may be connected to, for example, an Internet Protocol TV (IPTV) to receive and transmit an image, audio or data signal processed by a set-top box for IPTV to the controller 170 and transmit signals processed by the controller 170 to the set-top box for IPTV, in order to enable bidirectional communication, The IPTV may include an ADSL-TV, a VDSL-TV, an FTTH-TV and/or the like according to type of the transmission network, and/or may include a TV over DSL, a Video over DSL, a TV over IP (TVIP), a Broadband TV (BTV), or the like. The IPTV may include an Internet TV capable of Internet access or a full-browsing TV.

The memory 130 may store a program for performing signal processing and control in the controller 170, and may store a processed video, audio or data signal.

The memory 130 may perform a function to temporarily store a video, audio, or data signal input through the external device interface 122. The memory 130 may store information about predetermined broadcast channels through a channel storage function such as a channel map.

The memory 130 may include at least one of the following types of storage medium: a flash memory type, a hard disk type, a multimedia card micro type, a card type memory (e.g., SD memory, XD memory, etc), a RAM, and a ROM (EEPROM, etc). The video display device 100 may reproduce and provide a file (e.g. a moving image file, a still image file, a music file, a document file, or the like) stored in the memory 130 to the user.

Although FIG. 1 shows an example in which the memory 130 is provided separately from the controller 170, embodiments are not limited to this example. The memory 130 may be included in the controller 170.

The user input interface 121 may transmit a signal input by the user to the controller 170, or send a signal from the controller 170 to the user.

For example, the user input interface 121 may receive a user input signal (e.g. such as power on/off, channel selection or screen setup) from the remote controller 121*a* or transmit a signal from the controller 170 to the remote controller 121*a* according to various communication schemes such as a Radio Frequency (RF) communication scheme or an Infrared (IR) communication scheme.

The user input interface 121 may transmit a user input signal input through a local key such as, for example, a power key, a channel key, a volume key, or a setup key to the controller 170.

Also, for example, the user input interface 121 may transmit a control signal input by a sensor, which senses a user gesture, to the controller 170, or may transmit the signal from the controller 170 to the sensor. In this case, the sensor may include a touch sensor, an audio sensor, a position sensor, a motion sensor, etc.

The controller 170 may demultiplex an input stream or process demultiplexed signals through the tuner 110, the demodulator 111, or the external device interface 122 to generate and output a signal for video and audio output.

The video signal processed by the controller 170 may be input to the display 140, so that the video signal may be displayed as a video corresponding to the video signal. Also, the video signal processed by the controller 170 may be input to an external output device through the external device interface 122.

The audio signal processed by the controller 170 may be audibly output through the audio output device 160. The audio signal processed by the controller 170 may be input to an external output device through the external device interface 122.

In certain embodiments, the controller 170 may also include a demultiplexer, a video processor, and other such components.

In addition, the controller 170 may control an overall operation of the image display device 100. For example, the controller 170 may control the tuner 110 to tune in to a RF broadcast corresponding to a channel selected by the user or a previously stored channel.

Also, the controller 170 may control the image display device 100 through a user command input through the user input interface 121 or an internal program.

For example, the controller 170 controls the tuner 110 to input a signal of a channel selected in accordance with a predetermined channel selection command received through the user input interface 121, and processes a video, audio or data signal of the selected channel. The controller 170 may allow the channel information selected by the user to be output through the display 140 or the audio output device 160, together with the processed video or audio signal.

For another example, the controller 170 may allow a video signal or an audio signal from an external device, for example, camera or camcorder, which is input through the external device interface 122, to be output through the display 140 or the audio output device 160 in accordance with an external device video play command received through the user input interface 121.

In the mean time, the controller 170 may control the display 140 to display video. For example, the controller 170 may control the display 140 to display broadcast video input through the tuner 110, video externally input through the external device interface 122, video input through the network interface 123, or video stored in the memory 130.

The video displayed in the display 140 may be a still image, a moving image, a 2D image, or a 3D image.

The controller 170 may generate and display a predetermined object in the video displayed on the display 140 as a 3D object. For example, the object may be at least one of the following: a web page (e.g. newspaper, magazine, or the like), an Electronic Program Guide (EPG), various menus, a widget, an icon, a still image, a moving image, or text.

Such a 3D object may provide a sense of perceived depth different from that of the video displayed on the display 140. The 3D object may be processed such that the 3D object appears to be located in front of the video displayed on the display 140.

The controller 170 may determine a user's position based on an image captured using a image capture device. The controller 170 may obtain a distance (z-axis coordinate), for example, between the user and the image display device 100. The controller 170 may obtain an X-axis coordinate and a y-axis coordinate in the image display device 100 corresponding to the user's position.

The image display device 100 may further include a channel browsing processor for generating a thumbnail image corresponding to a channel signal or an external input signal. The channel browsing processor may receive a Transport Stream (TS) signal output from the demodulator 111 or a TS signal output from the external device interface 122, extract an image from the received TS signal, and generate a thumbnail image. The generated thumbnail image may be input to the controller 170 without conversion or after being encoded. The generated thumbnail image may be input to the controller 170 after being encoded into a stream format. The controller 170 may display a thumbnail list including a plurality of thumbnail images on the display 140 using the received thumbnail images. The thumbnail list may be displayed in a brief viewing manner in which the thumbnail list is displayed in a portion of the display 140 on which an image is being displayed, or in a full viewing manner in which the thumbnail list is displayed over most of the display 140.

The display 140 may convert an image signal, data signal, OSD signal or control signal processed by the controller 170, or an image signal, data signal or control signal received through the external device interface 122, and may generate a drive signal.

The display 140 may be flat or curved. The display 140 may be modified to change from being flat to curved, or vice versa. If the display 140 is curved it may provide a realistic picture quality and a sense of immersion. Such a flexible display may be implemented by an OLED panel, for example.

The display 140 may be configured to provide the user with 3D images. For 3D image viewing, the display 140 may be divided into a supplementary display type and a single display type.

In the single display type, 3D images may be realized on the display 140 without a separate 3D viewing device 140a (e.g., 3D glasses). Examples of the single display type may include various types, such as a lenticular type and a parallax barrier type.

In the supplementary display type, 3D images may be realized by using the 3D viewing device 195, in addition to the display 140. Examples of the supplementary display type may include various types, such as a Head-Mounted Display (HMD) type and a glasses type. The glasses type may be divided into a passive type such as a polarized glasses type and an active type such as a shutter glasses type. The HMD type may be divided into a passive type and an active type.

The display 140 may include a touch screen, and may function as an input device as well as an output device.

The driver 150 may be configured such that the display 140 is modified to change from being flat to curved. The driver 150 may be configured to flexibly modify the display 140 by applying physical force directly or indirectly to the display 140.

The audio output device 160 may receive the audio signal processed by the controller 170 (for example, a stereo signal, a 3.1 channel signal, or a 5.1 channel signal), and output it as audio. The audio output device 160 may be implemented as various types of speakers.

The image display device 100 may further include a sensor including at least either a touch sensor, an audio sensor, a position sensor, or a motion sensor, as described above, so as to detect a user's gesture. A signal detected by the sensor is transmitted to the controller 170 through the user input interface 121.

The controller 170 may detect a user's gesture by using images captured by a capture device, or signals detected by the sensor individually or in combination.

The power supply device 180 supplies power to the video display apparatus 100. Especially, the power supply device 180 may supply power to the controller 170 implemented in the form of a system on chip (SOC), the display 140 for displaying video, and the audio output device 160 for outputting audio. Also, the power supply device 180 may supply power to a heat generating part including hot wires according to embodiments.

The remote controller 121a may transmit a user input to the user input interface 121. The remote controller 121a may use Infrared (IR) communication, Radio Frequency Identification (RFID) communication, Bluetooth, Ultra Wideband (UWB), ZigBee, or the like. The remote controller 121a may receive the video, audio, or data signal output from the user input interface 121, and the remote controller 121a may then display or audibly output the received signal.

The image display device 100 may be a fixed digital broadcast receiver capable of receiving at least one of an ATSC (8-VSB) digital broadcast, a DVB-T (COFDM) digital broadcast, or an ISDB-T (BST-OFDM) digital broadcast, and/or a mobile digital broadcast receiver capable of receiving at least one of a terrestrial DMB digital broadcast, a satellite DMB digital broadcast, an ATSC-M/H digital broadcast, a DVB-H (COFDM) digital broadcast, or a media forward link only digital broadcast. The image display device 100 may be a cable, satellite or IPTV digital broadcast receiver.

An image display device as embodied and broadly described herein may include a TV receiver, a mobile phone, a smart phone, a notebook computer, a digital broadcast terminal, a Personal Digital Assistant (PDA), a Portable Multimedia Player (PMP), and/or the like.

The block diagram of the image display device 100 depicted in FIG. 1 is a block diagram of an exemplary embodiment. The respective elements of the block diagram may be combined, added or omitted according to the specification of the actually implemented image display device 100. That is, two or more elements may be integrated into a single element, or a single element may be divided into two or more elements as occasion demands. Furthermore, a function performed in each block is just for explaining an embodiment, and the detailed operation or device is not intended to limit the scope as broadly described herein.

Figure 2:
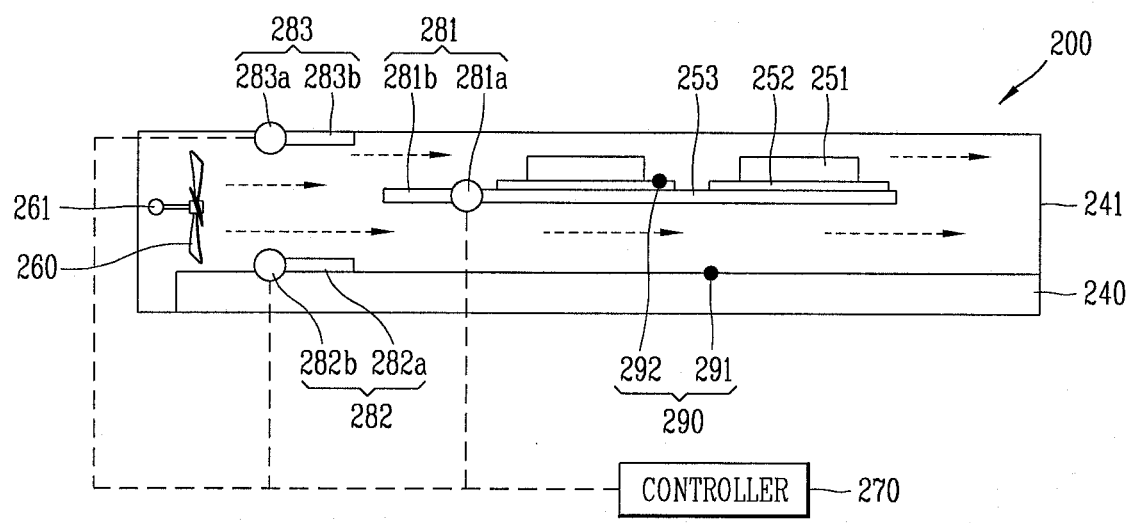
FIG. 2 is a cross sectional view of an image display device, according to an embodiment as broadly described herein.

FIG. 2 is a conceptual diagram of an image display device 200 according to an embodiment as broadly described herein.

The image display device 200 depicted in FIG. 2 is outdoor signage that is installed outdoors to convey visual information. The outdoor signage may be, for example, a device that is installed on a pedestrian path to exhibit an advertisement or that is installed at a bus stop to display such information as expected arrival times of buses.

Such a display device 200 may include an open frame 241 (a product that comes without a case or cover). A housing support serving as the case or cover of the open frame 241 is installed in advance in a place of installation, and outdoor signage is put into the housing, thus completing the installation.

The frame 241 may be attached to the image display device 200 so as to protect the internal parts of the outdoor signage provided in the form of the open frame 241. The frame 241 may be configured to accommodate the internal parts of the outdoor signage, and may be attached to the display 240 of the outdoor signage.

The image display device 200 includes the display 240, circuit components 251, a fan 260, and airflow distribution devices 281, 282, and 283.

The display 240 may form the front side of the image display device 200, and outputs visual information to the front side of the image display device 200. The visual information output from the display 240 may be an image, a moving image, etc.

The display 240 may include at least one of a Liquid Crystal Display (LCD), a Thin Film Transistor-LCD (TFT-LCD), an Organic Light Emitting Diode (OLED) display, a flexible display, a three-dimensional (3D) display, an e-ink display or the like.

The circuit components 251 are mounted inside the image display device 200, and spaced apart from the rear side of the display 240. The circuit components 251 include elements that process electric signals in the image display device 200.

A printed circuit board 252 is likewise mounted inside the image display device 200, and spaced apart from the rear side of the display 240. The printed circuit board 252 is electrically connected to the display 240 and the circuit components 251, especially, the circuit components 251 may be mounted directly on the printed circuit board 252.

If the printed circuit board 252 is placed parallel to the display 240, and the circuit components 251 are mounted on the printed circuit board 252, as shown in the drawing, placing the circuit components 251 to face the display 240 may cause heat to be concentrated in the space between the display 240 and the circuit components 251 due to the heat generated by the circuit components 251 and the heat generated from the display 240. Accordingly, the circuit components 251 may be mounted on the side of the printed circuit board 252 opposite to the side facing the display 240, so as to prevent heat concentration.

A separating plate 253 is installed spaced apart from the rear side of the display 240 so as to support the printed circuit board 252. The separating plate 253 may be placed parallel to the display 240 so that airflow for heat dissipation inside the image display device 200 is separated into an air stream for cooling the display 240 and an air stream for cooling the circuit components 251.

When the separating plate 253 supports the printed circuit board 252 and the circuit components 251 are mounted on the printed circuit board 252, the airflow for cooling the display 240 passes through the space between the display unit 240 and the separating plate 253 and the airflow for cooling the circuit components 251 passes through the remaining space separated by the separating plate 253.

The fan 260 is placed on the rear side of the display 240, and generates an airflow from one side to the other side of the display 240 so as to cool the display 240 and the circuit components 251. The fan 260, an air intake system that draws in air from outside the image display device 200, supplies air from outside to inside the image display device 200. When air is drawn in at a portion of the rear side of the display 240, and the fan 260 continuously rotates, the airflow generated by the fan 260 moves from one side of the display 240 to the other side of the display 240.

Vents may be formed on either side of the frame 241 so as to pass the outside air drawn in by the fan 260 through and discharge the airflow generated by the fan 260. The vents supply outside air to the fan 260, and let the air out when heat is transferred to the air from the display 240 or the circuit components 251.

The airflow distribution device 281, 282, and 283 may face the fan 260, and may distribute the airflow generated by the fan 260 toward the display 240 and the circuit components 251 depending on the relative temperatures of the display 240 and circuit components 251. There may be a variety of structures for the airflow distribution device 281, 282, and 283 to distribute the airflow generated by the fan 260 to the display 240 and the circuit components 251.

The airflow distribution device 281, 282, and 283 may include first airflow distributors 282 and 283 and a second airflow distributor 281.

The first airflow distributors 282 and 283 are installed adjacent to the fan 260 in a way that at least some parts are rotatable, and form a slope so that the airflow supplied from the fan 260 is asymmetrically distributed to the display 240 and the circuit components 251. As shown in the drawing, the first airflow distributors 282 and 283 may be installed on the rear side of the display 240 and on a side of the device 200 facing the rear side of the display 240. The side facing the rear side of the display 240 may be one side of the frame 241.

The first airflow distributor 282 installed on the rear side of the display 240 may form a slope with respect to the rear side of the display 240 so that the airflow supplied from the fan 260 is distributed to the circuit components 251. On the other hand, the first airflow distributor 283 installed on the side spaced apart from and facing the display 240 may form a slope with respect to the side facing the display 240 so that the airflow supplied form the fan 260 is distributed to the display 240.

The second airflow distributor 281 is installed spaced apart from the fan 260 in a way that at least some parts are rotatable. The second airflow distributor 281 forms a slope so as to maintain the direction of the airflow distributed by the first airflow distributors 282 and 283. The second airflow distributor 281 may be installed on a lateral side of the separating plate 253 so as to face the fan 260.

Each of the airflow distributors 281, 282, and 283 includes a driving motor 281a, 282a, and 283a and a plate 281b, 282b, and 283b, respectively.

The driving motors 281a, 282a, and 283a are configured to be rotatable about one respective axis. The rotation axes of the driving motor 281a, 282a, and 283a may be substantially perpendicular to the direction of the airflow generated by the fan 260.

The plates 281b, 282b, and 283b are protruded from the driving motor 281a, 282a, and 283a, and connected to the driving motors 281a, 282a, and 283a to rotate in conjunction with the driving motors 281a, 282a, and 283a. The plates 281b, 282b, and 283b form a slope by rotating in conjunction with the driving motors 281a, 282a, and 283a so that the airflow supplied from the fan 260 is asymmetrically distributed to the display 240 and the circuit components 251.

The plates 282b and 283b of the first airflow distributors 282 may protrude in the same direction as the airflow generated by the fan 260, as shown in the drawing. As the first airflow distributors 282 and 283 are installed on the rear side of the display 240 or on the side facing the rear side thereof, they do not help sufficiently distribute the airflow but rather block the passage of the airflow if the plates 282b and 283b are protruded in the opposite direction of the airflow.

The plate 281b of the second airflow distributor 281 may protrude in the opposite direction of the airflow, as shown in the drawing. As the second airflow distributor 281 is installed on the separating plate 253, it does not block the passage of the airflow even if installed in the opposite direction of the airflow. Moreover, if the plate 281b of the second airflow distributor 281 is installed in the same direction as the airflow, a support for supporting the second airflow distributor 281 is required. Therefore, the plate 281b is installed in the opposite direction of the airflow on a lateral side of the separating plate 253 so that it may be used without a support.

The controller 270 is electrically connected to the airflow distribution device 281, 282, and 283 to determine the angle of rotation of the airflow distribution device 281, 282, and 283 so as to control the direction of the airflow distributed to the display 240 and the circuit components 251. As the angle of rotation of the airflow distribution device 281, 282, and 283 may be determined by the angles of rotation of the respective driving motors 281a, 282a, and 283a, the controller 279 may be electrically connected to the driving motors 281a, 282a, and 283a. The controller 270 may perform data processing and calculation operations, among the circuit components 251 or elements mounted on the printed circuit board 252.

The controller 270 determines the angles of rotation of the driving motors 281a, 282a, and 283a in order to distribute an appropriate amount of air to the display 240 and the circuit components 251 and prevent concentration of heat in a certain area. To distribute more air to a higher-temperature region, the controller 270 determines the angles of rotation of the driving motors 281a, 282a, and 283a by comparing the relative temperatures of the display 240 and the circuit components 251 with each other.

An example of the operative mechanism of the controller 270 will be described. The controller 270 may rotate the driving motors 281a, 282a, and 283a at a preset angle at preset time intervals, according to data provided based on the installation environment of the image display device 200. In the image display device 200, such as outdoor signage, that is installed outdoors, a region where heat is concentrated may vary depending on the installation environment. For example, if the image display device 200 is installed in an area with a lot of sunlight, the display 240 exposed outside the image display device 200 is heated by solar heat, and the temperature of the display 240 becomes higher than that of the circuit components 251 inside the image display device 200. On the other hand, if the image display device 200 is installed in an area with little sunlight, the temperature of the circuit components 251 become higher than that of the display 240 due to heat generated by the circuit components 251.

Accordingly, the controller 270 may prevent heat concentration in a certain area by rotating the driving motors 281a, 282a, and 283a according to data provided based on the installation environment of the image display device 200.

The data provided based on the installation environment of the image display device 200 may be the installation position, such as latitude or longitude, of the image display device 200, the amount of sunlight in each season, temperatures in each season, sunrise time, and sunset time.

The controller 270 may determine which of the display 240 and the circuit components 251 will get more air, based on data, and may rotate the plates 281b, 282b, and 283b connected to the driving motors 281a, 282a, and 283a by rotating the driving motors 281a, 282a, and 283a to position the plates 281b, 282b and 283b at an appropriate angle. The slope, or angle, formed by the plates 281b, 282b, and 283b causes the direction of the airflow supplied from the fan 260 to change, thereby selectively distributing air to the display 240 and the circuit components 251.

A mechanism of airflow distribution by the controller 270 will be described with reference to FIGS. 3A and 3B.

Figure 3A:
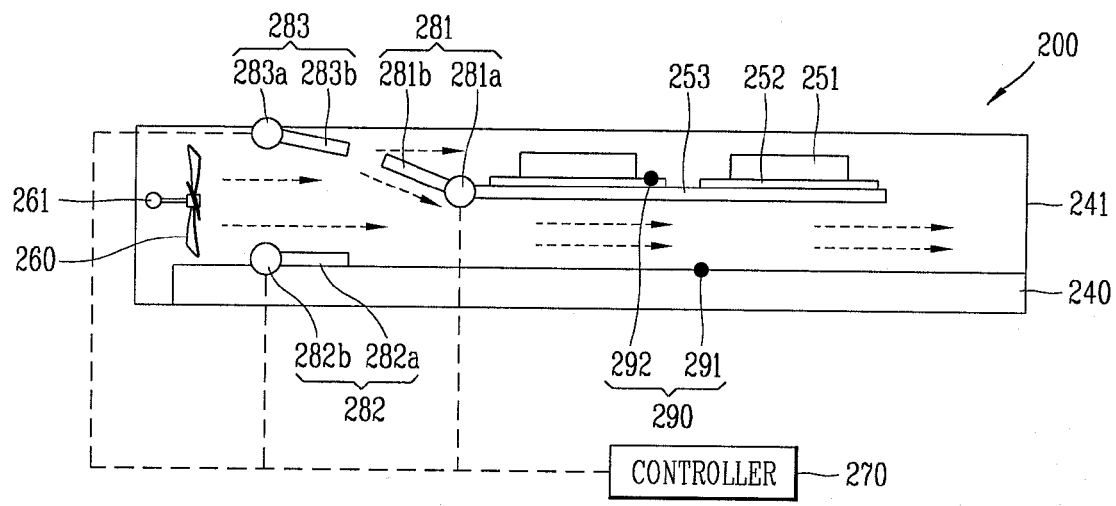
FIG. 3A illustrates a state in which heat is concentrated on a display of the image display device shown in FIG. 2.

FIG. 3A is a conceptual diagram of airflow in the image display device 200 when heat is concentrated on the display 240. In the image display device 200 installed in an area with long day hours or an area with a lot of sunlight, the temperature of the display 240 is typically higher than that of the circuit components 251 because the display 240 is heated by solar heat. The controller 270 controls the airflow distribution device 281, 282, and 283 and rotates the driving motors 281a, 282a, and 283a, based on preset data.

In this situation, the driving motor 282a of the first airflow distributor 282 installed on the rear side of the display 240 does not rotate, but is kept in close contact with the rear side of the display 240. On the other hand, the driving motor 283a of the first airflow distributor 283 installed on the side of the device 200 spaced apart from and facing the rear side of the display 240 rotates by the control of the controller 270, and the plate 283b forms a slope or angle with respect to the frame 241. Accordingly, the airflow generated by the fan 260 is asymmetrically distributed by the plates 282b and 283b of the first airflow distributors 282 and 283. Most of the airflow generated by the fan 260 is distributed to the display 240, and a smaller amount of air is distributed to the circuit components 251.

The second airflow distributor 281 is likewise controlled by the controller 270. The driving motor 281a of the second airflow distributor 281 rotates by the control of the controller 270, and the plate 281b forms a slope at an acute angle with respect to the side of the separating plate 253 opposite to the side facing the display 240. Accordingly, the second airflow distributor 281 maintains the direction of the airflow distributed by the first airflow distributors 282 and 283. The airflow generated by the fan 260 is distributed more to the display 240 than to the circuit components 251 by the operations of the first airflow distributors 282 and 283 and second airflow distributor 281. The first airflow distributors 282 and 283 and the second airflow distributor 281 may be kept in this state until the temperature of the display 240 less than or equal to the temperature of the circuit components 251.

Figure 3B:
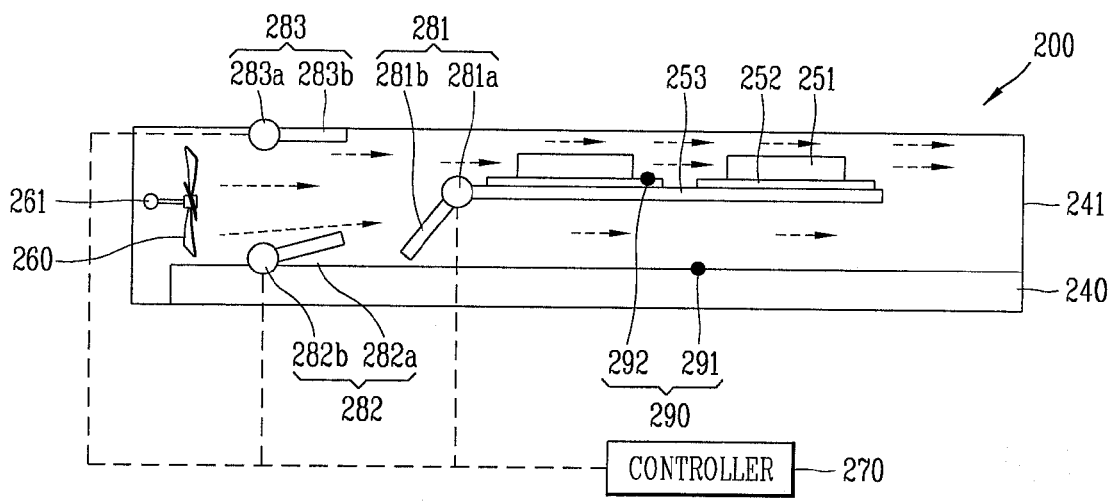
FIG. 3B illustrates a state in which heat is concentrated on circuit components of the image display device shown in FIG. 2.

FIG. 3B is a conceptual diagram of airflow in the image display device 200 when heat is concentrated on the circuit components 251. In the image display device 200 installed in an area with long night hours or an area with little sunlight, the temperature of the circuit components 251 is typically higher than that of the display 240. The controller 270 controls the airflow distribution device 281, 282, and 283 and rotates the driving motors 281a, 282a, and 283a, based on preset data.

The driving motor 282a of the first airflow distributor 282 installed on the rear side of the display 240 rotates by the control of the controller 270, and the plate 282b forms a slope with respect to the rear side of the display 240. On the other hand, the driving motor 283a of the first airflow distributor 283 installed on the side spaced apart from and facing the rear side of the display 240 does not rotate, but is kept in close contact with the side facing the rear side of the display 240. Accordingly, the airflow generated by the fan 260 is asymmetrically distributed by the plates 282b and 283b. Most of the airflow generated by the fan 260 is distributed to the circuit components 251, and less air is distributed to the display 240.

The second airflow distributor 281 is likewise controlled by the controller 270. The driving motor 281a of the second airflow distributor 281 rotates by the control of the controller 270, and the plate 281b forms a slope at an acute angle with respect to the side of the separating plate 253 opposite to the side facing the display 240. Accordingly, the second airflow distributor 281 maintains the direction of the airflow distributed by the first airflow distributors 282 and 283. The airflow generated by the fan 260 is distributed more to the circuit components 251 than to the display 240 by the operations of the first airflow distributors 282 and 283 and second airflow distributor 281. The first airflow distributors 282 and 283 and the second airflow distributor 281 may be kept in this state until the temperature of the circuit components 251 is less than or equal to the temperature of the display 240.

Figure 4:
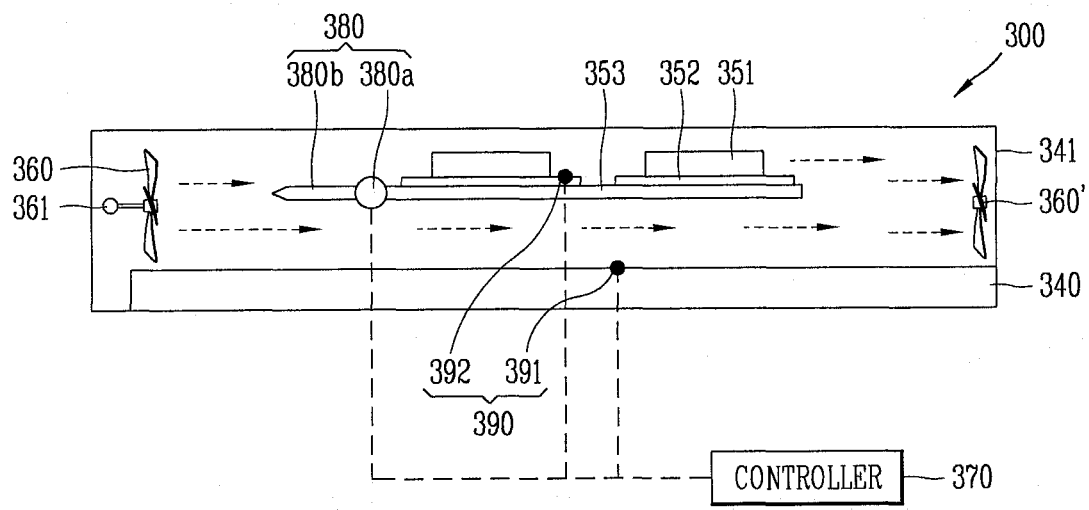
FIG. 4 is a cross sectional view of an image display device, according to another embodiment as broadly described herein.

FIG. 4 is a conceptual diagram of a image display device 300 according to another embodiment as broadly described herein.

As shown in FIG. 4, an airflow distribution device 380 is installed on a lateral end of a separating plate 353 so as to face a fan 360. The airflow distribution device 380 includes a driving motor 380a configured to rotate a plate 380b to form a slope, or angle, with respect to the separating plate 353. The end of the plate 380b may be tapered so as to reduce collision with air blown parallel to the plate 380b. Particularly, if the plate 380b is at an angle towards the fan 360, the airflow generated by the fan 360 and the end of the plate 380b collide due to the thickness of the plate 380b, and the air colliding with the end of the plate 380b is of little use in cooling the display 340 or the circuit components 351. As shown in the drawing, the tapered end of the plate 380b may help minimize the amount of air colliding with the plate 380b, thereby improving the cooling effect.

An airflow direction control device 361 is attached to the fan 360 to enable a change in the airflow direction of the fan 360 and changes the direction of the rotation axis of the fan 360 within a preset range. The airflow direction control device 361 is hinged to at least part of the fan 360, and configured to be rotatable around a rotation axis, which is perpendicular to the rotation axis of the fan 360, so as to control the direction of the rotation axis of the fan 360.

The airflow distribution device 380 and the airflow direction control device 361 may operate in conjunction with each other. For example, the airflow distribution device 380 and the airflow direction control device 361 may operate such that airflow is concentrated in a higher-temperature region, depending on the temperatures of the display 340 and the circuit components 351. If the temperature of the display 340 is higher than the temperature of the circuit components 351, the airflow direction control device 361 operates such that airflow from the fan 360 is directed towards the display 340, and the airflow distribution device 380 operates such that most of the airflow is distributed to the display 340. If the temperature of the circuit components 351 mounted on the circuit boards 352 is higher than the temperature of the display 340, the airflow direction control device 361 and the airflow distribution device 380 operate in the opposite way from what has been described above.

An exhaust fan 360' is installed at a side of the frame 341 opposite the fan 360 and exhausts the airflow generated by the fan 360. The fan 360 and the exhaust fan 360' may be placed on the rear side of the display 340, symmetrical to each other. The exhaust fan 360' operates to exhaust air, whereas the fan 360 draws in air. Vents may be formed in the frame 341 that encloses the fan 360 and the exhaust fan 360' to pass air through.

Temperature sensors 390 measure the temperatures of the display 340 and the circuit components 351. A first temperature sensor 391 may be installed on the rear side of the display 340 so as to measure the temperature of the display 340, and a second temperature sensor 392 may be installed on the printed circuit board 352 so as to measure the temperature of the circuit components 351.

The controller 370 controls the airflow distribution device 380 so that airflow is asymmetrically/selectively distributed to the display 340 and the circuit components 351, and may control the airflow distribution device 380 based on relative temperatures measured by the temperature sensors 390.

Figure 5:
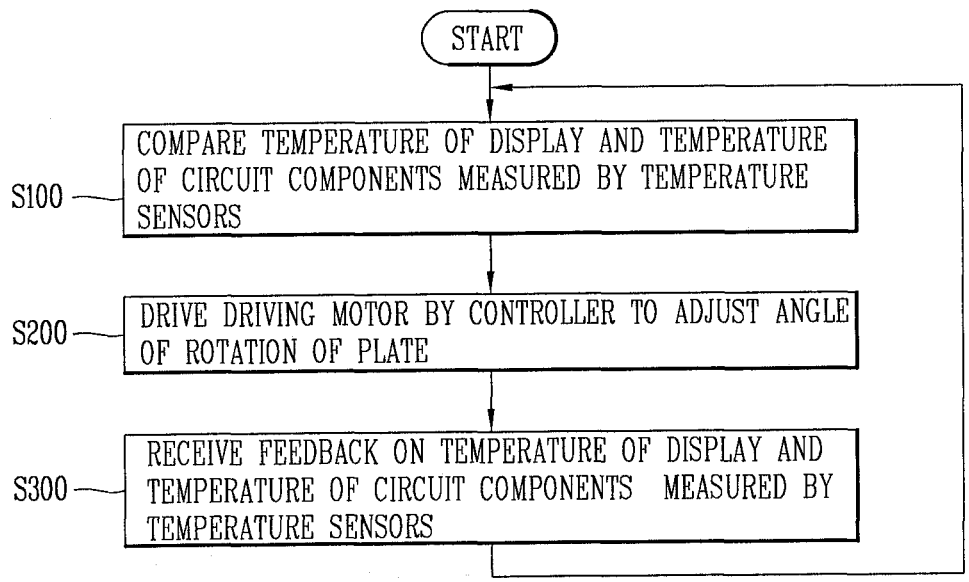
FIG. 5 is a flowchart of a cooling control mechanism of the controller of the image display device shown in FIG. 4, according to an embodiment as broadly described herein.

A cooling control mechanism of the controller 370 that distributes airflow in conjunction with the temperature sensors 390 will be described with reference to FIG. 5.

First, the controller 370 compares the temperature of the display 340 and the temperature of the circuit components 351, which are measured by the temperature sensors 390 (S100). The temperature sensors 390 respectively installed at the display 340 and the circuit components 351 measure their temperatures, and measurement results are delivered to the controller 370 electrically connected to the temperature sensors 390. The controller 370 determines which of the display 340 and the circuit components 351 will get more air, by comparing the temperatures of the display 340 and the circuit components 351.

Next, the controller 370 drives the driving rotor 380a to adjust the angle of rotation of the plate 380b (S200). The angle of rotation of the plate 380b adjusted by the controller 370 is determined based on the temperatures of the display 340 and the circuit components 350 measured by the temperature sensors 390. For example, the greater the temperature difference between the display 340 and the circuit components 351, the wider the angle of rotation of the plate 380, and the less the temperature difference between the display 340 and the circuit components 351, the less the angle of rotation of the plate 380b.

The controller 370 gets feedback related to the temperatures of the display 340 and the circuit components 351 measured by the temperature sensors 390 for the duration of heat dissipation via airflow (S300). For example, when the temperature difference between the display 340 and the circuit components 351 decreases since most of the airflow is distributed to the display 340, the controller 370 controls the driving motor 380a to reduce the angle of rotation of the plate 380b. The controller 370 may receive continuous feedback regarding the temperatures of the display 340 and the circuit components 351 from the temperature sensors 390 to adjust the angle of rotation of the plate 380b.

The airflow direction control device 361 and the airflow distribution device 380 that operate in accordance with the cooling control mechanism of the controller 370 will be described below.

Figure 6A:
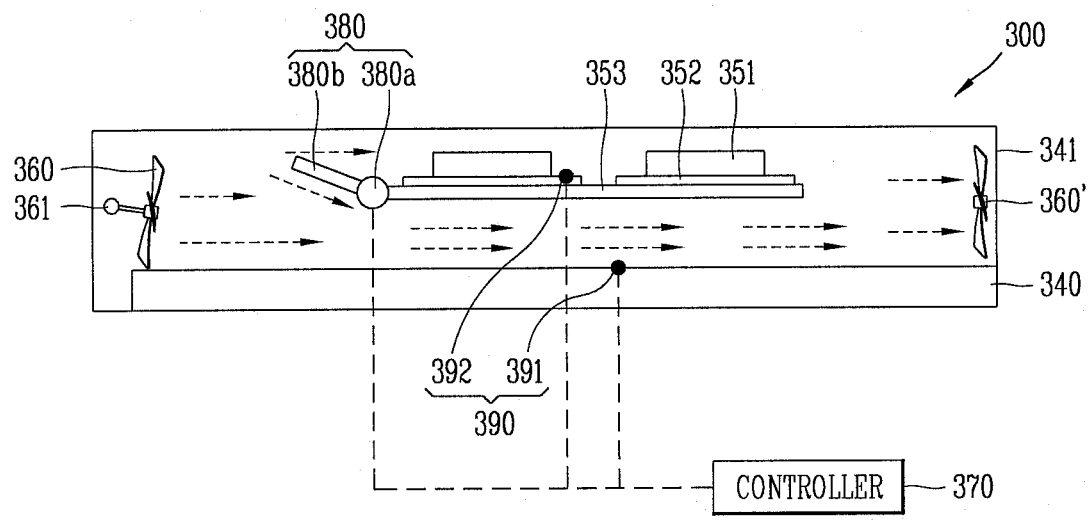
FIG. 6A illustrates a state in which heat is concentrated on a display of the image display device shown in FIG. 4.

FIG. 6A is a conceptual diagram of airflow in the image display device 300 when heat is concentrated on the display 340.

If the measurement results of the temperatures of the display 340 and the circuit components 351 by the temperature sensors 390 show that the temperature of the display 340 is higher than the temperature of the circuit components 351, the controller 370 controls the airflow distribution device 380 and the airflow direction control device 361 so that the rotation axis of the airflow direction control device 361 is directed towards the display 340 so that airflow is directed towards the display 340. The controller 370 also control the airflow distribution device 380 so that the plate 380b forms a slope or angle with respect to the separating plate 353 and most of the airflow is distributed to the display 340. When heat is transferred to the air from the display 340 and the circuit components 351, the air is exhausted from the image display device 300 by the exhaust fan 360'.

The controller 370 is kept updated about the temperatures of the display 340 and the circuit components 351 by the temperature sensors 390, thereby keeping the airflow direction control device 361 and the airflow distribution device 380 under continuous control.

Figure 6B:
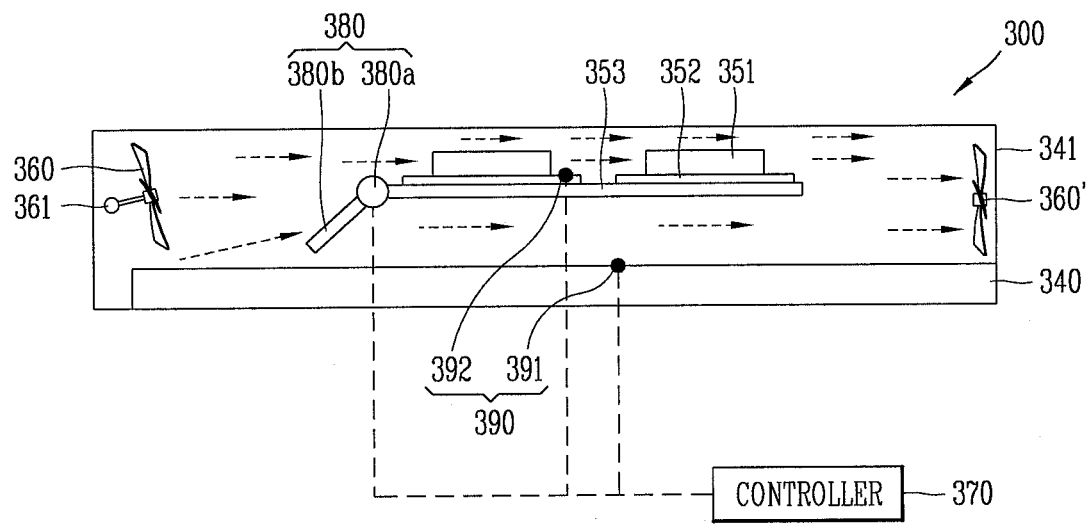
FIG. 6B illustrates a state in which heat is concentrated on circuit components of the image display device shown in FIG. 4.

FIG. 6B is a conceptual diagram of airflow in the image display device 300 when heat is concentrated on the circuit components 351.

If the measurement results of the temperatures of the display 340 and the circuit components 351 by the temperature sensors 390 show that the temperature of the circuit components 351 is higher than the temperature of the display 340, the controller 270 controls the airflow distribution device 380 and the airflow direction control unit 361 so that the rotation axis of the airflow direction control unit 361 is directed towards the circuit components 351 so that airflow is directed towards the circuit components 351. The controller 370 also controls the airflow distribution device 380 so that the plate 380b forms a slope or angle with respect to the separating plate 353 and most of the airflow is distributed to the circuit components 351. When heat is transferred to the air from the display 340 and the circuit components 351, the air is exhausted from the image display device 300 by the exhaust fan 360'.

The controller 370 is kept updated about the temperatures of the display 340 and the circuit components 351 by the temperature sensors 390, thereby keeping the airflow direction control device 361 and the airflow distribution device 380 under continuous control.

The above-described image display devices are not limited to the configurations and methods of the above embodiments, and all or some of the above embodiments may be selectively combined in order to provide various modified embodiments.

In an image display device as embodied and broadly described herein, the airflow distribution device may distribute more airflow to a region where heat is concentrated and efficiently cool the inside of the image display device because it is capable of distributing the airflow created by the fan depending on the temperatures of the display and the circuit components.

Moreover, the controller may monitor the temperatures of the display and the circuit components and continuously distribute the airflow from the fan to the display and the circuit components by getting feedback about the temperatures from the temperature sensors.

In addition, the controller may distribute the airflow from the fan to the display and the circuit components according to climate data provided based on the installation environment.

An image display device is provided which is capable of efficiently cooling an inside thereof and maintaining its performance even when installed outdoors.

An image display device is provided which is capable of preventing heat concentration.

An image display device is provided which is capable of improving heat dissipation efficiency without a fan.

An image display device, as embodied and broadly described herein, may include a display for displaying visual information; circuit components spaced apart from the rear side of the display; a fan that is installed on the rear side of the display and creates an airflow from one side to the other side of the display so as to cool the display and the circuit components; and an airflow distribution unit that faces the fan and is configured to distribute the airflow created by the fan towards the display and the circuit components depending on the temperatures of the display and the circuit components.

The airflow distribution unit may include a driving motor configured to be rotatable around one axis; and a plate that is protruded from the driving motors and form a slope by rotating in conjunction with the driving motors so that the airflow supplied from the fan is asymmetrically distributed to the display and the circuit components.

The end of the plate may be tapered so as to reduce collision with air blown parallel to the plate.

The image display device may also include a printed circuit board that is electrically connected to the display and the circuit components and spaced apart from the rear side of the display, wherein the circuit components are mounted on the side of the printed circuit board opposite to the side facing the display so as to prevent concentration of heat in the space between the circuit components and the display.

The image display device may also include a separating plate that is installed spaced apart from the rear side of the display so as to support the printed circuit board, and placed parallel to the display so as to separate airflow into an air stream to be distributed to the display and an airstream to be distributed to the circuit components.

The airflow distribution unit may be installed on the rear side of the separating plate so as to face the fan.

The image display device may also include a controller that is electrically connected to the airflow distribution unit to determine the angle of rotation of the driving motor so as to control the direction of the airflow distributed to the display and the circuit components.

The image display device may also include temperature sensors that measure the temperatures of the display and the circuit components, the temperature sensors including: a first temperature sensor installed on the rear side of the display to measure the temperature of the display; and a second temperature sensor installed on the printed circuit board with the circuit components mounted thereon to measure the temperature of the circuit components.

The controller may determine the angle of rotation of the driving motor based on the temperatures of the display and the circuit components, which are measured by the temperature sensors.

The controller may rotate the driving motor at a preset angle at preset time intervals, according to data provided based on the installation environment of the image display device.

The image display device may also include a frame that is configured to accommodate the circuit components and the fan and attached to the display, the frame including vents on either side so as to pass outside air through and let out the airflow created by the fan.

The image display device may also include an airflow direction control unit that is attached to the fan to enable a change in the airflow direction of the fan and changes the direction of the rotation axis of the fan within a preset range.

The airflow direction control unit may be hinged to at least part of the fan and configured to be rotatable around a rotation axis, which is perpendicular to the rotation axis of the fan, so as to control the direction of the rotation axis of the fan.

The controller may control the airflow direction control unit to determine the airflow direction of the fan depending on the temperatures of the display and the circuit components.

The airflow direction control unit may operate in conjunction with the airflow distribution unit and control the rotation axis of the fan to be directed towards either the display or the circuit components depending on which side gets more air from the airflow distribution unit.

The airflow distribution unit may include a first airflow distributor that is installed adjacent to the fan in a way that at least some parts are rotatable, and forms a slope so that the airflow supplied from the fan is asymmetrically distributed to the display and the circuit components; and a second airflow distributor that is installed spaced apart from the fan in a way that at least some parts are rotatable and forms a slope so as to maintain the direction of the airflow distributed by the first airflow distributors.

The first airflow distributor may form a slope with respect to the rear side of the display so that the airflow supplied from the fan is distributed to the circuit components.

The first airflow distributor may form a slope with respect to the side facing the display so that the airflow supplied form the fan is distributed to the display.

The image display device may also include a controller that is electrically connected to the airflow distribution unit to determine the angle of rotation of the first and second airflow distributors so as to control the direction of the airflow distributed to the display and the circuit components.

The image display device may also include an exhaust fan that is installed on the other side of the fan and lets out the airflow created by the fan, the fan and the exhaust fan being placed on the rear side of the display, being symmetrical to each other.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image display device comprising:
    a display for displaying visual information;
    circuit components spaced apart from a rear side of the display;
    a fan installed near a first end of the display, to a rear of the display, and generating an airflow from a first end of the display to a second end of the display so as to cool the display and the circuit components;
    an airflow distribution device that faces the fan and is configured to selectively distribute the airflow generated by the fan towards the display and the circuit components based on respective temperatures of the display and the circuit components; and
    a controller configured to control the fan and the airflow distribution device based on the temperatures of the display and the circuit components.

2. The image display device of claim 1, wherein the airflow distribution device comprises:
    a driving motor configured to generate a rotation force; and
    a plate having a proximal end thereof coupled to the driving motor so as to be rotated by the driving force generated by the driving motor such that the airflow generated by the fan is asymmetrically distributed to the display and the circuit components based on the respective temperatures thereof.

3. The image display device of claim 2, wherein a distal end of the plate is tapered so as to guide air flowing parallel to the plate in a corresponding direction.

4. The image display device of claim 1, further comprising a printed circuit board spaced apart from the rear side of the display and electrically connected to the display and the circuit components,
    wherein the circuit components are mounted on a side of the printed circuit board opposite a side of the printed circuit board facing the rear side of the display so as to prevent concentration of heat in a space between the circuit components and the display.

5. The image display device of claim 4, further comprising a separating plate installed spaced apart from the rear side of the display so as to support the printed circuit board, wherein the separating plate is positioned parallel to the display so as to separate airflow generated by the fan into a first air stream to be distributed to the display and a second airstream to be distributed to the circuit components.

6. The image display device of claim 5, wherein the airflow distribution device is installed at a lateral end of the separating plate so as to face the fan.

7. The image display device of claim 2, wherein the controller is electrically connected to the airflow distribution device to determine an angle of rotation of the driving motor and the plate coupled thereto so as to control a direction of the airflow generated by the fan and distributed to the display and the circuit components.

8. The image display device of claim 7, further comprising temperature sensors that measure the temperatures of the display and the circuit components, the temperature sensors comprising:
 a first temperature sensor installed on the rear side of the display to measure the temperature of the display; and
 a second temperature sensor installed on a printed circuit board on which the circuit components are mounted to measure the temperature of the circuit components.

9. The image display device of claim 8, wherein the controller is configured to determine the angle of rotation of the driving motor and the plate coupled thereto based on the temperatures of the display and the circuit components measured by the temperature sensors.

10. The image display device of claim 1, wherein the controller is configured to rotate the driving motor and the plate coupled thereto at a preset angle at preset time intervals based on previously set data related to an installation environment of the image display device.

11. The image display device of claim 1, wherein the image display device further comprises a frame coupled to the display and configured to receive the circuit components and the fan in a space formed between the frame and the display,
 the frame comprising vents on one or more sides thereof so as to guide outside air into the space and exhaust the airflow generated by the fan.

12. The image display device of claim 7, further comprising an airflow direction control device coupled to the fan and configured to change an orientation direction of a rotation axis of the fan within a preset range to change a direction of the airflow generated by the fan.

13. The image display device of claim 12, wherein the airflow direction control device is rotatably coupled to the fan about a rotation axis which is perpendicular to the rotation axis of the fan, so as to control the orientation direction of the rotation axis of the fan.

14. The image display device of claim 12, wherein the controller is configured to control the airflow direction control device to generate a particular airflow direction of the fan based on the temperatures of the display and the circuit components.

15. The image display device of claim 12, wherein the airflow direction control device operates together with the airflow distribution device to orient the rotation axis of the fan towards either the display or the circuit components corresponding to a position of the airflow distribution device.

16. The image display device of claim 1, wherein the airflow distribution device comprises:
 a first airflow distributor rotatably installed adjacent to the fan so as to be positioned at an incline with respect to the display and asymmetrically distribute the airflow generated by the fan to the display and the circuit components; and
 a second airflow distributor rotatably installed spaced apart from the fan and downstream of the first airflow distributor so as to be positioned at an incline with respect to the display and maintain the airflow distribution direction of the first airflow distributor.

17. The image display device of claim 16, wherein the controller is configured to position the first airflow distributor at an incline with respect to the rear side of the display to guide the airflow generated by the fan to the circuit components.

18. The image display device of claim 16, further comprising a frame coupled to the display such that a receiving space is formed between the display and the frame, and the fan, the airflow distribution device and the circuit components are installed in the receiving space, the image display device further comprising:
 a separating plate installed in the receiving space, spaced apart from and positioned in parallel to the rear side of the display and the frame to separate airflow flowing through the receiving space, wherein the second airflow distributor is rotatably coupled to an end of the separating plate facing the fan; and
 a printed circuit board installed on a side of the separating plate facing the frame, the circuit components being mounted on the printed circuit board,
 wherein the first airflow distributor comprises:
  a first lower distributor rotatably coupled to the rear side of the display, near the fan; and
  a first upper distributor rotatably coupled to the frame, at a position corresponding to the first lower distributor.

19. The image display device of claim 18, wherein the controller is configured to
 rotate the first upper airflow distributor away from the frame, maintain the first lower airflow distributor in a position against the rear side of the display, and to rotate the second airflow distributor toward the frame to distribute air generated by the fan to the display, and
 rotate the first lower airflow distributor away from the rear side of the display, maintain the first upper airflow distributor in a position against the frame, and to rotate the second airflow distributor toward the rear side of the display to distribute air generated by the fan to the circuit components.

20. The image display device of claim 1, further comprising an exhaust fan installed near a second end of the display opposite the first end thereof, to the rear of the display, to exhaust the airflow generated by the fan,
 wherein the fan and the exhaust fan are positioned to the rear of the display, at opposite ends of the display, symmetrical to each other.

* * * * *